(12) United States Patent
Tanda et al.

(10) Patent No.: US 11,692,677 B2
(45) Date of Patent: Jul. 4, 2023

(54) LIGHT EMITTING DEVICE

(71) Applicant: NICHIA CORPORATION, Anan (JP)

(72) Inventors: Yuichiro Tanda, Shinjuku-ku (JP); Toshio Matsushita, Naruto (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/868,677

(22) Filed: Jul. 19, 2022

(65) Prior Publication Data
US 2022/0349531 A1 Nov. 3, 2022

Related U.S. Application Data

(63) Continuation of application No. 17/506,601, filed on Oct. 20, 2021, now Pat. No. 11,421,829, which is a (Continued)

(30) Foreign Application Priority Data

Dec. 16, 2005 (JP) .................................. 2005-364127

(51) Int. Cl.
*F21K 9/232* (2016.01)
*H01L 33/62* (2010.01)
(Continued)

(52) U.S. Cl.
CPC .............. *F21K 9/232* (2016.08); *F21K 9/235* (2016.08); *F21V 3/02* (2013.01); *F21V 9/30* (2018.02);
(Continued)

(58) Field of Classification Search
CPC .. F21Y 2103/10; F21K 9/00–278; F21K 9/64; H01L 33/50–508
See application file for complete search history.

(56) References Cited

U.S. PATENT DOCUMENTS 4,211,955 A * 7/1980 Ray .................. F21V 23/02
313/500
4,663,652 A 5/1987 Nishizawa
(Continued)

FOREIGN PATENT DOCUMENTS

CA  2343909     2/2001
EP  1116419 B1  7/2001
(Continued)

OTHER PUBLICATIONS

Japanese Office Action for corresponding JP Application No. 2005-364127, dated Oct. 4, 2011.
(Continued)

*Primary Examiner* — Sean P Gramling
(74) *Attorney, Agent, or Firm* — Mori & Ward, LLP

(57) ABSTRACT

A light emitting device including a bulb having a side surface, a board elongated longer in a first direction than in a second direction perpendicular to the first direction, and a plurality of light emitting elements mounted on the board. Each of the plurality of light emitting elements has an upper surface and a lower surface opposite to the upper surface, where the lower surface is mounted on the board. The device includes a plurality of sets of metal plates and leads electrically connected to the plurality of light emitting elements, and a wavelength conversion member covering the light emitting elements and a portion of each of the metal plates. The board, the light emitting elements, the sets of metal plates and leads, and the wavelength conversion member are disposed in the bulb. The upper surface of each of the light emitting elements faces the side surface of the bulb.

20 Claims, 12 Drawing Sheets

Related U.S. Application Data continuation of application No. 17/017,676, filed on Sep. 11, 2020, now Pat. No. 11,187,385, which is a continuation of application No. 16/727,924, filed on Dec. 27, 2019, now Pat. No. 10,801,676, which is a continuation of application No. 16/211,140, filed on Dec. 5, 2018, now Pat. No. 10,598,317, which is a continuation of application No. 15/666,578, filed on Aug. 2, 2017, now Pat. No. 10,180,213, which is a continuation of application No. 15/231,735, filed on Aug. 8, 2016, now Pat. No. 9,752,734, which is a continuation of application No. 13/831,797, filed on Mar. 15, 2013, now Pat. No. 9,491,813, which is a continuation of application No. 13/672,713, filed on Nov. 9, 2012, now Pat. No. 9,491,812, which is a continuation of application No. 11/639,062, filed on Dec. 14, 2006, now Pat. No. 8,366,295.

(51) Int. Cl.

| | | |
|---|---|---|
| *F21V 9/32* | (2018.01) | |
| *F21V 9/38* | (2018.01) | |
| *F21V 13/14* | (2006.01) | |
| *F21V 9/30* | (2018.01) | |
| *H05B 33/04* | (2006.01) | |
| *F21V 29/70* | (2015.01) | |
| *F21K 9/235* | (2016.01) | |
| *F21V 3/02* | (2006.01) | |
| *F21V 19/00* | (2006.01) | |
| *F21V 31/00* | (2006.01) | |
| *H01L 25/075* | (2006.01) | |
| *H01L 33/50* | (2010.01) | |
| *H01L 33/54* | (2010.01) | |
| *F21Y 109/00* | (2016.01) | |
| *F21Y 101/00* | (2016.01) | |
| *F21Y 115/30* | (2016.01) | |
| *F21Y 115/10* | (2016.01) | |

(52) U.S. Cl.
CPC .............. *F21V 9/32* (2018.02); *F21V 9/38* (2018.02); *F21V 13/14* (2013.01); *F21V 19/006* (2013.01); *F21V 29/70* (2015.01); *F21V 31/005* (2013.01); *H01L 25/0753* (2013.01); *H01L 33/501* (2013.01); *H01L 33/508* (2013.01); *H01L 33/62* (2013.01); *H05B 33/04* (2013.01); *F21Y 2101/00* (2013.01); *F21Y 2109/00* (2016.08); *F21Y 2115/10* (2016.08); *F21Y 2115/30* (2016.08); *H01L 33/505* (2013.01); *H01L 33/507* (2013.01); *H01L 33/54* (2013.01); *H01L 2224/32225* (2013.01); *H01L 2224/48095* (2013.01); *H01L 2224/48247* (2013.01); *H01L 2224/73265* (2013.01); *H01L 2924/0102* (2013.01); *H01L 2924/01004* (2013.01); *H01L 2924/01063* (2013.01); *H01L 2924/01078* (2013.01); *H01L 2924/01079* (2013.01); *H01L 2924/181* (2013.01)

(56) References Cited

U.S. PATENT DOCUMENTS

| | | | |
|---|---|---|---|
| 4,727,289 A | 2/1988 | Uchida | |
| 4,727,649 A | 3/1988 | Nishizawa | |
| 5,463,229 A | 10/1995 | Takase et al. | |
| 5,925,898 A | 7/1999 | Spath | |
| 5,998,925 A | 12/1999 | Shimizu et al. | |
| 6,066,861 A | 5/2000 | Hohn et al. | |
| 6,262,534 B1 | 7/2001 | Johnson et al. | |
| 6,345,903 B1 | 2/2002 | Koike et al. | |
| 6,350,041 B1 | 2/2002 | Tarsa et al. | |
| 6,396,082 B1 | 5/2002 | Fukasawa et al. | |
| 6,501,084 B1 | 12/2002 | Sakai et al. | |
| 6,523,978 B1 | 2/2003 | Huang | |
| 6,568,834 B1 | 5/2003 | Scianna | |
| 6,628,086 B2 | 9/2003 | Hayashi et al. | |
| 6,634,770 B2 | 10/2003 | Cao | |
| 6,642,072 B2 | 11/2003 | Inoue et al. | |
| 6,661,167 B2 | 12/2003 | Eliashevich et al. | |
| 6,680,568 B2 | 1/2004 | Fujiwara et al. | |
| 6,787,990 B2 | 9/2004 | Cok | |
| 6,791,259 B1 | 9/2004 | Stokes et al. | |
| 6,796,698 B2 | 9/2004 | Sommers et al. | |
| 6,914,267 B2 | 7/2005 | Fukasawa et al. | |
| 6,949,772 B2 | 9/2005 | Shimizu et al. | |
| 6,956,247 B1 | 10/2005 | Stockman | |
| 6,961,190 B1 | 11/2005 | Tamaoki et al. | |
| 7,086,756 B2 | 8/2006 | Maxik | |
| 7,212,699 B2 | 5/2007 | Chen et al. | |
| 7,220,996 B2 | 5/2007 | Furukawa et al. | |
| 7,397,068 B2 | 7/2008 | Park et al. | |
| 7,436,002 B2 | 10/2008 | Brunner et al. | |
| 7,498,734 B2 | 3/2009 | Suehiro et al. | |
| 7,518,158 B2 | 4/2009 | Keller et al. | |
| 7,682,036 B2 | 3/2010 | Reiff et al. | |
| 7,700,958 B2 | 4/2010 | Nishi et al. | |
| 7,723,740 B2 | 5/2010 | Takashima et al. | |
| 7,819,549 B2 | 10/2010 | Narendran et al. | |
| 7,824,937 B2 | 11/2010 | Suehiro et al. | |
| 7,842,526 B2 | 11/2010 | Hadame et al. | |
| 7,875,897 B2 | 1/2011 | Suehiro | |
| 8,106,584 B2 | 1/2012 | Tabuchi et al. | |
| 2002/0020843 A1 | 2/2002 | Uemura | |
| 2003/0025657 A1 | 2/2003 | Iwafuchi | |
| 2003/0031015 A1 | 2/2003 | Ishibashi | |
| 2003/0151361 A1 | 8/2003 | Ishizaka | |
| 2003/0168720 A1 | 9/2003 | Kamada | |
| 2003/0173895 A1 | 9/2003 | Kato et al. | |
| 2003/0177636 A1 | 9/2003 | Lin et al. | |
| 2003/0189217 A1 | 10/2003 | Imai | |
| 2004/0007980 A1 | 1/2004 | Shibata | |
| 2004/0008525 A1 | 1/2004 | Shibata | |
| 2004/0239242 A1 | 12/2004 | Mano et al. | |
| 2004/0256630 A1 | 12/2004 | Cao | |
| 2004/0257797 A1 | 12/2004 | Suehiro et al. | |
| 2005/0001225 A1 | 1/2005 | Yoshimura et al. | |
| 2005/0068776 A1 | 3/2005 | Ge | |
| 2005/0156496 A1 | 7/2005 | Takashima et al. | |
| 2006/0082296 A1 | 4/2006 | Chua et al. | |
| 2006/0152926 A1 | 7/2006 | Hama et al. | |
| 2006/0183625 A1 | 8/2006 | Miyahara | |
| 2007/0014034 A1 | 1/2007 | Lee et al. | |
| 2007/0063213 A1* | 3/2007 | Hsieh ................. H01L 25/0753 257/E33.073 |

FOREIGN PATENT DOCUMENTS

| | | |
|---|---|---|
| JP | 60-110180 | 6/1985 |
| JP | 02-036553 | 2/1990 |
| JP | 04-103154 | 4/1992 |
| JP | 06-314858 | 11/1994 |
| JP | 08-130282 | 5/1996 |
| JP | 11-121807 | 4/1999 |
| JP | 11-186590 | 7/1999 |
| JP | 11-300683 | 11/1999 |
| JP | 3064051 U | 12/1999 |
| JP | 2000-31531 | 1/2000 |
| JP | 2000-58913 | 2/2000 |
| JP | 2000-277808 | 10/2000 |
| JP | 3075689 U | 2/2001 |
| JP | 3172947 B2 | 5/2001 |
| JP | 3172947 | 6/2001 |
| JP | 2001-351404 | 12/2001 |
| JP | 2002-124705 | 4/2002 |
| JP | 2002-232020 | 8/2002 |
| JP | 2002-246652 | 8/2002 |
| JP | 2002-270904 | 9/2002 |
| JP | 2002-280614 | 9/2002 |

(56) References Cited

FOREIGN PATENT DOCUMENTS

| JP | 2002-319708 | 10/2002 |
| --- | --- | --- |
| JP | 2003-51616 | 2/2003 |
| JP | 3093138 U | 4/2003 |
| JP | 2003-249692 | 9/2003 |
| JP | 2004-087812 | 3/2004 |
| JP | 2004-207649 | 7/2004 |
| JP | 2004-363632 | 12/2004 |
| JP | 2005-35864 | 2/2005 |
| JP | 3108487 U | 4/2005 |
| JP | 2005-191097 | 7/2005 |
| KR | 20-0403690 Y1 | 12/2005 |
| KR | 10-2007-0043330 | 4/2007 |
| WO | 2005/003625 | 1/2005 |

OTHER PUBLICATIONS

Japanese Office Action for corresponding JP Application No. 2005-364127, dated Jun. 5, 2012.
Japanese Office Action for corresponding JP Application No. 2005-364127, dated Feb. 22, 2011.
Japanese Office Action for corresponding JP Application No. 2005-364127, dated Apr. 23, 2013.
Japanese Office Action for corresponding JP Application No. 2012-194542, dated Aug. 6, 2013.
Office Action with Form PTO-892 Notice of References Cited issued by the U.S. Patent and Trademark Office for the U.S. Appl. No. 13/672,713, dated Jun. 7, 2013.
Japanese Office Action for corresponding JP Application No. 2013-210467, dated Jun. 17, 2014.
Office Action issued by the U.S. Patent and Trademark Office for the U.S. Appl. No. 13/672,713, dated Jan. 9, 2014.
Office Action with Form PTO-892 Notice of References Cited issued by the U.S. Patent and Trademark Office for the U.S. Appl. No. 13/672,713, dated Apr. 7, 2014.
Office Action with Form PTO-892 Notice of References Cited issued by the U.S. Patent and Trademark Office for the U.S. Appl. No. 13/672,713, dated Sep. 29, 2014.
Office Action with Form PTO-892 Notice of References Cited issued by the U.S. Patent and Trademark Office for the U.S. Appl. No. 13/672,713, dated May 29, 2015.
Office Action with Form PTO-892 Notice of References Cited issued by the U.S. Patent and Trademark Office for the U.S. Appl. No. 13/672,713, dated Nov. 6, 2015.
Office Action issued by the United States Patent and Trademark Office for the U.S. Appl. No. 13/672,713, dated Apr. 22, 2016.
Notice of Allowance issued by the United States Patent and Trademark Office for the U.S. Appl. No. 13/672,713, dated Jul. 6, 2016.
Office Action issued by the U.S. Patent and Trademark Office for the U.S. Appl. No. 13/831,797, dated Jul. 19, 2013.
Office Action with Form PTO-892 Notice of References Cited issued by the U.S. Patent and Trademark Office for the U.S. Appl. No. 13/831,797, dated Jan. 8, 2014.
Office Action with Form PTO-892 Notice of References Cited issued by the U.S. Patent and Trademark Office for the U.S. Appl. No. 13/831,797, dated May 14, 2014.
Office Action with Form PTO-892 Notice of References Cited issued by the U.S. Patent and Trademark Office for the U.S. Appl. No. 13/831,797, dated Dec. 4, 2014.
Office Action issued by the U.S. Patent and Trademark Office for the U.S. Appl. No. 13/831,797, dated Jun. 29, 2015.
Office Action with Form PTO-892 Notice of References Cited issued by the U.S. Patent and Trademark Office for the U.S. Appl. No. 13/831,797, dated Nov. 13, 2015.
Notice of Allowance issued by the United States Patent and Trademark Office for the U.S. Appl. No. 13/831,797, dated May 26, 2016.
Office Action with Form PTO-892 Notice of References Cited issued by the U.S. Patent and Trademark Office for the U.S. Appl. No. 11/639,062, dated Jun. 26, 2008.
Office Action with Form PTO-892 Notice of References Cited issued by the U.S. Patent and Trademark Office for the U.S. Appl. No. 11/639,062, dated Jan. 21, 2009.
Office Action with Form PTO-892 Notice of References Cited issued by the U.S. Patent and Trademark Office for the U.S. Appl. No. 11/639,062, dated Aug. 17, 2009.
Office Action with Form PTO-892 Notice of References Cited issued by the U.S. Patent and Trademark Office for the U.S. Appl. No. 11/639,062, dated Feb. 1, 2010.
Office Action issued by the U.S. Patent and Trademark Office for the U.S. Appl. No. 11/639,062, dated Aug. 3, 2010.
Office Action with Form PTO-892 Notice of References Cited issued by the U.S. Patent and Trademark Office for the U.S. Appl. No. 11/639,062, dated Feb. 3, 2011.
Office Action issued by the U.S. Patent and Trademark Office for the U.S. Appl. No. 11/639,062, dated Jul. 14, 2011.
Notice of Allowance issued by the United States Patent and Trademark Office for the U.S. Appl. No. 11/639,062, dated Oct. 11, 2012.
Office Action with Form PTO-892 Notice of References Cited issued by the U.S. Patent and Trademark Office for the U.S. Appl. No. 15/231,735, dated Sep. 2, 2016.
Office Action issued by the U.S. Patent and Trademark Office for the U.S. Appl. No. 15/231,735, dated Jan. 10, 2017.
Notice of Allowance issued by the United States Patent and Trademark Office for the U.S. Appl. No. 15/231,735, dated May 2, 2017.
Office Action with Form PTO-892 Notice of References Cited issued by the U.S. Patent and Trademark Office for the U.S. Appl. No. 15/666,578, dated Sep. 26, 2017.
Office Action issued by the U.S. Patent and Trademark Office for the U.S. Appl. No. 15/666,578, dated May 14, 2018.
Notice of Allowance issued by the United States Patent and Trademark Office for the U.S. Appl. No. 15/666,578, dated Sep. 6, 2018.
Office Action with Form PTO-892 Notice of References Cited issued by the U.S. Patent and Trademark Office for the U.S. Appl. No. 16/211,140, dated Jan. 23, 2019.
Office Action with Form PTO-892 Notice of References Cited issued by the U.S. Patent and Trademark Office for the U.S. Appl. No. 16/211,140, dated Jul. 17, 2019.
Notice of Allowance issued by the United States Patent and Trademark Office for the U.S. Appl. No. 16/211,140, dated Sep. 27, 2019.
Office Action with Form PTO-892 Notice of References Cited issued by the U.S. Patent and Trademark Office for the U.S. Appl. No. 16/727,924, dated Feb. 3, 2020.
Notice of Allowance issued by the United States Patent and Trademark Office for the U.S. Appl. No. 16/727,924, dated Jun. 12, 2020.
N.F. Gardner et al., "Transparent-substrate $(Al_xGa_{1-x})_{0.5}In0.5P$ light-emitting diodes with thin active regions", pp. 190-191, Retrieved from the Internet: URL: https://ieeexplore.ieee.org/aocument/806367.
Holcomb et al., "The LED Lightbulb: Are we there yet? Progress and Challenges for Solid State Illumination", Retrieved from the Internet: URL: https://ieeexplore.ieee.org/document/1297797.
Zorpette, "Let There Be Light", IEEE Spectrum, Sep. 2002, pp. 70-74, Retrieved from the Internet: URL: https://ieeexplore.ieee.org/document/1030972.
Office Action with Form PTO-892 Notice of References Cited issued by the U.S. Patent and Trademark Office for the U.S. Appl. No. 17/017,676, dated Mar. 11, 2021.
Notice of Allowance issued by the United States Patent and Trademark Office for the U.S. Appl. No. 17/017,676, dated Jul. 20, 2021.
Notice of Allowance with Form PTO-892 Notice of References Cited issued by the United States Patent and Trademark Office for the parent U.S. Appl. No. 17/506,601, dated Apr. 20, 2022.

\* cited by examiner

LIGHT EMITTING DEVICE

CROSS-REFERENCE TO RELATED APPLICATIONS

The present application is a continuation application of U.S. patent application Ser. No. 17/506,601 filed on Oct. 20, 2021, which is a continuation application of U.S. patent application Ser. No. 17/017,676 filed on Sep. 11, 2020, which issued as U.S. Pat. No. 11,187,385, which is a continuation application of U.S. patent application Ser. No. 16/727,924 filed on Dec. 27, 2019, which issued as U.S. Pat. No. 10,801,676, which is a continuation application of U.S. patent application Ser. No. 16/211,140 filed on Dec. 5, 2018, which issued as U.S. Pat. No. 10,598,317, which is a continuation application of U.S. patent application Ser. No. 15/666,578 filed on Aug. 2, 2017, which issued as U.S. Pat. No. 10,180,213, which is a continuation application of U.S. patent application Ser. No. 15/231,735 filed on Aug. 8, 2016, which issued as U.S. Pat. No. 9,752,734, which is a continuation application of U.S. patent application Ser. No. 13/831,797 filed on Mar. 15, 2013, which issued as U.S. Pat. No. 9,491,813, which is a continuation application of U.S. patent application Ser. No. 13/672,713 filed on Nov. 9, 2012, which issued as U.S. Pat. No. 9,491,812, which is a continuation application of U.S. patent application Ser. No. 11/639,062 filed on Dec. 14, 2006, which issued as U.S. Pat. No. 8,366,295, and which claims priority under 35 U.S.C. § 119 to Japanese Patent Application No. 2005-364127, filed on Dec. 16, 2005. The contents of these applications are incorporated herein by reference in their entirety.

BACKGROUND OF THE INVENTION

1. Field of the Invention

The present invention relates to a light emitting device.

2. Description of the Related Art

Light emitting devices that employ light emitting elements are small but high effective in terms of electric power consumption, and emit vivid color light. In addition, semiconductor elements are employed as the light emitting elements, thus, there are no concerns about bulb burnout and so on. Additionally, semiconductor elements have features, such as excellent initial drive characteristics, resistance to vibration or ON/OFF repeats. Since semiconductor elements have these excellent features, light emitting devices that employ semiconductor light emitting elements such as light emitting diode (hereinafter, occasionally referred to as "LED") and semiconductor laser (hereinafter, occasionally referred to as "LD") have been used as various types of light sources. For example, a semiconductor light emitting element has a light emitting layer that is laminated on a transparent base member such as sapphire substrate, GaN substrate, and SiC substrate. In the case where the semiconductor light emitting element is formed in a substantially box shape by cutting, light outgoes not only through the upper surface of the substantially box shape, i.e., its top surface, but also through the lower surface, i.e., its bottom surface, and the side surfaces.

In consideration of the light outgoing surfaces, a lighting apparatus with a light emitting element as discussed above that is mounted on a transparent conductive portion formed on a transparent board is proposed. In this lighting apparatus, an extending lead is connected to the light emitting element, and a transparent or translucent resin covers the light emitting element, the transparent board and the lead. This lighting apparatus can emit light in 360-degree directions. See Japanese Patent Publication No. 3172947.

SUMMARY OF THE INVENTION

According to one aspect of the present invention, a light emitting device includes a board having a first surface and a second surface opposite to the first surface, the board being longer in a first direction than in a second direction perpendicular to the first direction in a plan view, and the first surface having a first end portion and a second end portion opposite to each other in the first direction. The light emitting device also includes a plurality of light emitting elements mounted on the first surface of the board, and the plurality of light emitting elements is arrayed in a row along the first direction. The light emitting device further includes a wavelength conversion member adapted to convert wavelength of light emitted from the plurality of light emitting elements, and the wavelength conversion member includes a first portion covering the plurality of light emitting elements and a second portion covering the second surface of the board in a cross-sectional view. The light emitting device also includes a first metal plate disposed on the first end portion of the board, and a second metal plate disposed on the second end portion of the board. The plurality of light emitting elements includes a first light emitting element located closest to the first metal plate among the plurality of light emitting elements, and a second light emitting element located closest to the second metal plate among the plurality of light emitting elements. The first metal plate is electrically connected to the first light emitting element via a wire. The first metal plate has a first end surface facing the first light emitting element, and a second end surface opposite to the first end surface and exposed from the wavelength conversion member. The second metal plate is electrically connected to the second light emitting element via a wire. The second metal plate has a first end surface facing the second light emitting element, and a second end surface opposite to the first end surface and exposed from the wavelength conversion member. The plurality of light emitting elements on the first surface of the board is located between the first end surface of the first metal plate and the first end surface of the second metal plate.

DESCRIPTION OF THE EMBODIMENTS

Light Emitting Device

Figure 1:
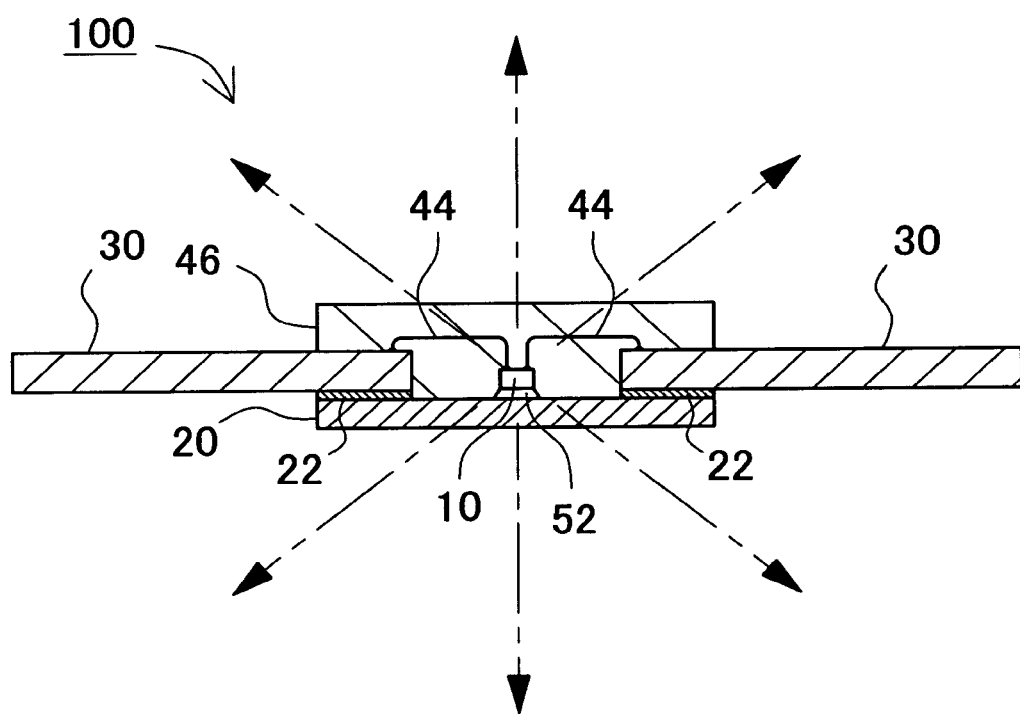
FIG. 1 is a cross-sectional view showing a light emitting device according to one embodiment of the present invention.
Figure 2:
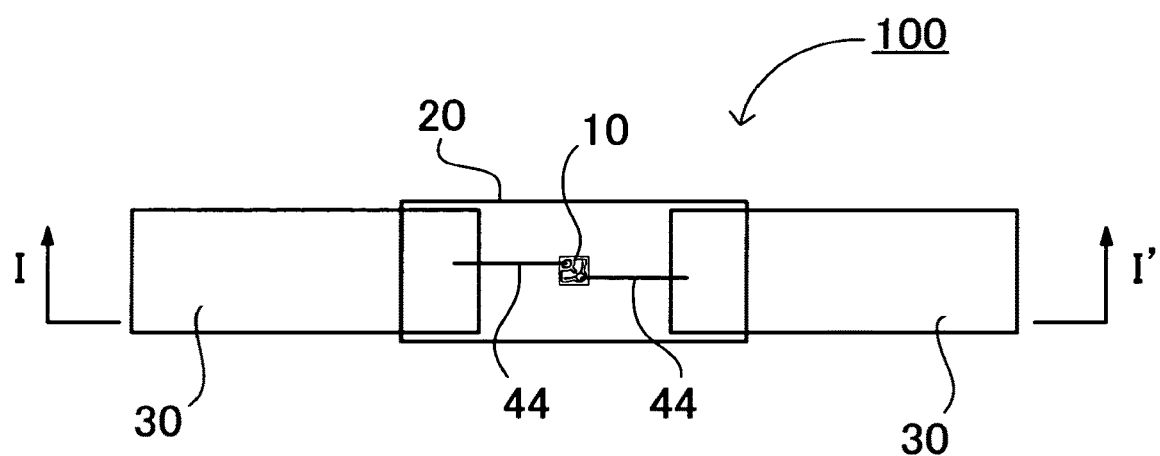
FIG. 2 is a plan view showing the light emitting device illustrated in FIG. 1.

FIGS. 1 and 2 are views showing a light emitting device 100 according to a first embodiment of the present invention. FIG. 1 is a cross-sectional view showing the light emitting device 100. FIG. 2 is a plan view showing the light emitting device 100. FIG. 1 corresponds a cross-sectional view taken along the line I-I' of FIG. 2. The light emitting device 100 illustrated in these Figures includes a light emitting element 10, a transparent board 20, a pair of conductor members 22, a covering member 46, and a pair of metal plates 30. The transparent board 20 is provided with the light emitting element 10 that is mounted thereon. The pair of conductor members 22 are secured on the transparent substrate 20. The covering member 46 is provided with the light emitting element 10 and the conductor members 22 that are located therein. The pair of metal plates 30 are inserted into the covering member 46 from side surfaces of the covering member 46, and are located on the pair of conductor members 22. This construction allows light from the light emitting element to outgo through a wide area. In addition, since the pair of metal plates project in directions different from each other, the light emitting device is stably fastened to terminals for power supply. Additionally, since the metal plates ensure heat dissipation, reliability and stability are also improved. An LED chip, an LD chip and so on can be employed as the light emitting element 10. An LED chip in FIG. 1 is mounted on the transparent board 20 with a transparent die-bonding member 52 by die-bonding.

Transparent Board 20

In the embodiment, the transparent board 20 has transmittance of 70% or more for light from the light emitting element 10, and serves as a support board that conducts heat generated by the light emitting element 10 to the metal plates 30. The light emitting element 10 is secured on the transparent board 20 with the transparent die-bonding member 52. The transparent die-bonding member 52 helps light to outgo through the lower surface of the light emitting element 10, and allows the light to pass the die-bonding member 52 and the transparent board 20. Thus, the light can outgo. Sapphire, GaN, beryllium oxide (beryllia), ZnO, SiC, Si, ZnO, ZnS, Al, Cu, W, AlN, SiC, diamond, copper diamond, ruby, and single crystal or polycrystal of GaN, Si and so on can be employed as this heat conductive type of transparent board 20.

Particularly, in the case where a conductive material is employed as the transparent board 20, a mount surface of the light emitting element 10 can provide electrical connection. Only one of electrodes requires wire bonding. Accordingly, it is possible to reduce the number of wire lines 44 and manufacturing cost, and to improve yields. From this viewpoint, it is possible to enhance improvement in reliability. Particularly, the wire lines 44 may be disconnected inside the resin that covers the wire lines 44 due to the difference in the thermal expansion coefficient, or the like. Reduction of the number of the wire lines 44 that are used inside the resin can reduce this risk.

It is preferable, in order to facilitate outgoing of light, that the lower surface of the transparent board 20 is a non-smooth surface. In this case, light can easily outgo through the lower surface. For example, the lower surface of the transparent board 20 is not polished and remains as an irregular. Alternatively, stripes or dimples can be formed on the lower surface of the transparent board 20 on purpose. In the case where the transparent board 20 has the thus-formed lower surface, even if a transparent member is not additionally disposed on the lower side of the transparent board 20, light that passes the lower surface of the light emitting element 10 can efficiently outgo. In addition, it is also preferable that the transparent board 20 has a curved lower surface. In this case, it is possible to reduce components of light that undergo total internal reflection at the lower surface of the transparent board 20. Therefore, it is possible to provide a light emitting device with high light-outgoing efficiency.

In addition, in order to reduce reflection at the boundary between the light emitting element 10 and the transparent board 20, it is preferable to adjust the refractive index difference between them. In the case where the light emitting element 10 has an element structure that is supported on a growth substrate, it is preferable that the refractive-index difference between the growth substrate and the transparent board 20 is small. Alternatively, the refractive index of the growth substrate is smaller than the refractive index of the transparent board 20. When materials for them are thus determined, reflection of light can be small. For example, in the case where the light emitting element 10 has a semiconductor layer that is grown on a sapphire substrate, sapphire is preferably used as the transparent board. On the other hand, in the case where the light emitting element 10 is a GaN group semiconductor element that does not have a growth substrate, a transparent board formed of GaN is preferably used.

Die-Bonding Member 52

In this embodiment, a material of the die-bonding member 52 is not specifically limited, if it can secures the light emitting element 10 on the transparent board 20, and can passes light from the light emitting element 10. An organic material, such as thermoplastic resin and thermosetting resin, an inorganic material, and a hybrid material of them can be used. Specifically, epoxy resin as thermosetting resin, acrylic resin and polyimide resin as thermoplastic resin, and so on can be given as examples. On the other hand, if the die-bonding member 52 is colored due to deterioration caused by light, heat and so on, the light-outgoing efficiency decreases. For this reason, the die-bonding member 52 preferably has heat resistance, light resistance and heat conductivity. In addition, in order to adjust the thermal expansion coefficient or electrical conductivity of the die-bonding member 52, a filler can be added to these resins.

Metal Plate 30

Figure 3:
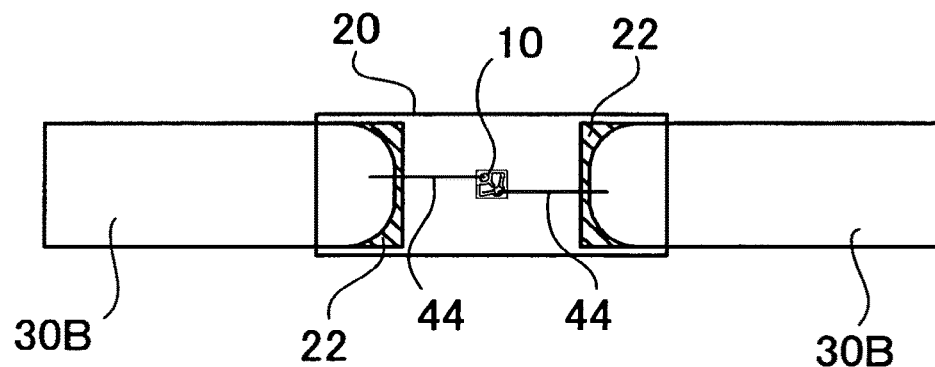
FIG. 3 is a plan view showing a light emitting device that has metal plates with rounded corners on edges of the metal plates.

The metal plates 30 are inserted into the covering member 46 from side surfaces of the covering member 46, and are fastened to the transparent board 20 so that the conductor member 22 is interposed between each of the metal plates 30 and the transparent board 20. The metal plates preferably have rounded corners that are located on edge sides thereof as shown in the metal plate 30B illustrated in the plan view of FIG. 3. In this case, it is possible to relieve residual stress after being secured to the transparent board 20. The metal plate 30 preferably formed of an excellent heat conductive and electrical conductive material with surfaces that are plated with a metal capable of reflecting light from the light emitting element 10.

Copper, Kovar (trademark) as alloy of iron, nickel and cobalt, an alloy of Kovar and copper, and so on can be given as examples of excellent heat conductive material. Since these materials have heat conductivity higher than ordinary conductors, they can improve heat dissipation of light emitting device and facilitate higher power output. In the embodiment, particularly, phosphor bronze is preferably used. Phosphor bronze has excellent corrosion resistance, wear resistance, plating characteristics, stress-and-corrosion cracking resistance, electrical conductivity and heat conductivity, and additionally has excellent processability in pressing, bending, drawing and so on.

In addition, prior to plating surfaces of the aforementioned material, it is preferable that copper strike plating is performed. In this case, oxides on the material are eliminated, and the material can be activated and plated at a time. Accordingly, the material is coated with a copper film with good tackiness. Therefore, it is possible to improve metal adhesiveness on the whole surfaces of material, and additionally to improve corrosion resistance. Additionally, the material metal is prevented from dissolution into a plating bath. Therefore, it is possible to prevent contamination in the bath.

It is preferable that the material, which is thus subjected to surface treatment, is plated with a metal that can reflects light from the light emitting element 10. Particularly, it is preferable that the material is provided with a conductive film that has glossiness of 90 or more by plating. In this specification, glossiness is a value based on JIS Standard that is represented by specular reflection factor in percentage when light from the light emitting element 10 is incident at 60° and is measured by VSR300A small surface color-difference meter manufactured of Nippon Denshoku Industries Co., Ltd. wherein the surface of a glass with refractive index of 1.567 is defined as glossiness 0. Specifically, Au, Ag, Al, and so on, can be given as examples for plating main material. In addition, in the case where the metal plate 30 and the light emitting element 10 are electrically connected with the metal wire lines 44, it is preferable that a main material for plating on the surface of the metal plate 30 is the same material as a main material with the metal wire lines 44.

Figure 14:
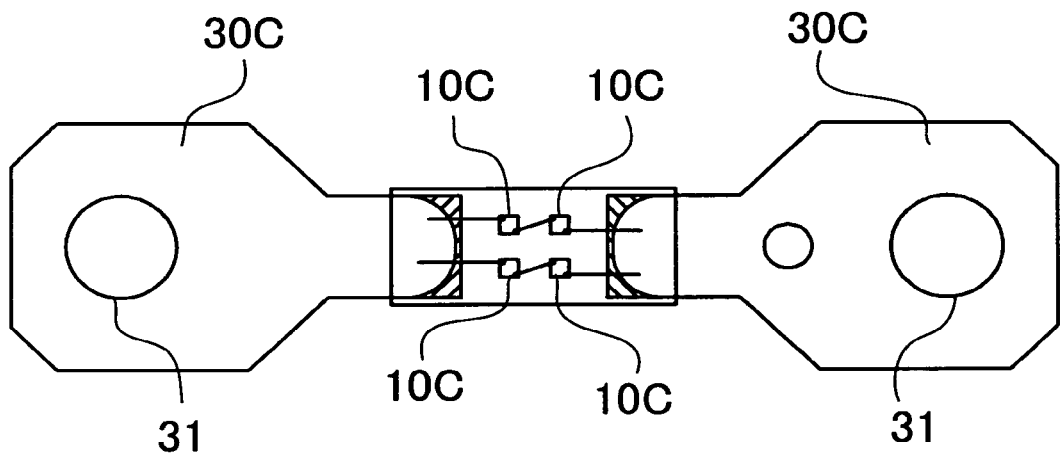
FIG. 14 is a plan view showing a light emitting device with a plurality of light emitting elements being arranged in a matrix shape.

The metal plate 30 has a substantially rectangular-shaped end that is connected to the light emitting element 10 with the wire line 44, and the other end that is exposed from the transparent member to be mounted to an external portion. In the light emitting device according to this embodiment, the other end has a two-rectangular shape that has a rectangle with the same width as the other end and a substantially square shape with a width wider than the other end as shown in a later-discussed metal plate 30C illustrated in FIG. 14, or the like. In this construction, it is possible to improve heat dissipation toward and installation on the external portion. In addition, corners of the substantially two-rectangular shape are preferably rounded. This shape provides ease of handling of the light emitting device. Additionally, a plate screw opening 31 can be formed in a region with wider area in the two-rectangular shape to fasten the light emitting device to the external portion. In this case, the light emitting device can be fastened to high thermally conductive metal or the like so as not to interpose an organic material between them.

The metal plates 30 are disposed on right and left sides of the light emitting element 10 and spaced away from each other at an interval, and are exposed from side surfaces of the covering member 46 that are opposed to each other. Thus, metal plates 30 can conduct heat from the light emitting element 10 through the transparent board 20 to effectively dissipate the heat externally. In the case where multiple light emitting elements are mounted, in the case where a light emitting element with positive and negative electrodes located on the same surface side is mounted in a flip-chip manner, or the like, conductive lines with a width narrower than the light emitting element may be disposed between the pair of metal plates. This construction can provide various types of mount manners without cutting off light that is emitted from the light emitting element and outgoes through the lower surface thereof. In addition, as discussed later, the metal plates 30 that extend in a right-and-left direction serve as attachment portions that are attached to a transparent bulb 60.

Conductor Member 22

The transparent board 20 and the metal plate 30 are welded. This welding is conducted by using the conductor member 22 that is previously formed on the transparent board 20. It is preferable that the coat area of the conductor member 22 is smaller or larger than an adhesion surface between the transparent board 20 and the metal plate 30. In other words, the adhesion surface preferably has a shape different from an alloy film surface. The reason is to reduce residual stress that is produced in the transparent board 20 after welding. Therefore, it is possible to provide highly reliable light emitting device. Particularly, in the case where the coat area of the conductor member 22 is larger than the adhesion surface between the transparent board 20 and the metal plate 30, it is possible to reduce the aforementioned residual stress while keeping adhesive strength in check. For this reason, it is preferable that the coat area of the conductor member 22 is larger than the adhesion surface. The conductor member 22 is preferably formed of a thermal conductive material that can relieve the difference between the thermal expansion coefficients of the transparent board 20 and the metal plate 30. Specifically, tungsten, molybdenum or a mixture of copper and at least one element of them is preferably employed. The conductor 22 is preferably formed by printing.

In addition, it is preferable that the pair of conductor members 22 occupy 20% to 50% of the surface of the transparent board 20. In the case of more than 50%, light outgoing efficiency decreases, and additionally the residual stress after the pair of conductor members 22 are adhered to the transparent board 20 is large. In the case of less than 20%, the pair of conductor members cannot be adhered to the transparent board 20 at enough adhesive strength. On the other hand, internal adhesion terminal portions of the pair of conductor members have 20% to 50% of thickness relative to thickness of the transparent board 20. In the case of less than 20%, the residual stress after the pair of conductor members are adhered to the transparent board 20 is large. In the case of more than 50%, it is difficult that the pair of conductor members are adhered to the transparent board 20 at enough adhesive strength.

The die-bonding member 52 bonds the light emitting elements 10 and the transparent board 20. A binder resin as an adhesive material bonds the transparent board 20 and the conductor member 22. In addition, thermal conductivities at these boundaries can be maintained by improvement of thermal conductivities of the die-bonding member 52 and the binder resin. For example, in the case where powder alumina or diamond is mixed in the binder resin, the thermal conductivity of the binder resin is improved.

Covering Member 46

After the light emitting element 10 and the conductor members 22 are secured on the transparent board 20, and the necessary wire lines 44 are fastened by bonding or the like, the covering member 46 formed of a transparent resin covers the periphery of them. A silicone resin, which has excellent heat resistance and light resistance, can be suitably employed as the covering member 46. In the illustration of FIG. 1, a rectangular-parallelepiped-shaped silicone resin has a profile similar to the transparent board 20 located below the resin. The resin covers the light emitting element 10 on the transparent board 20.

Second Transparent Member 40

Figure 4:
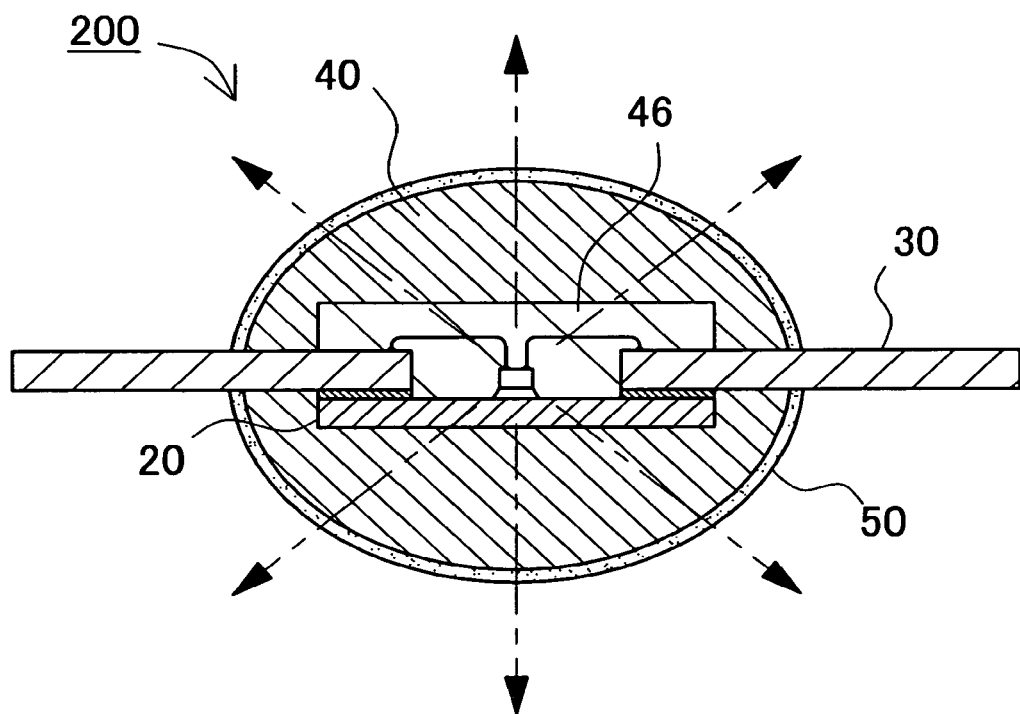
FIG. 4 is a cross-sectional view showing a light emitting device with a transparent member being formed in a round shape.

A second transparent member 40 can additionally cover the covering member 46. FIG. 4 is a cross-sectional view showing a light emitting device 200 with the second transparent member 40 covering the covering member 46. In the case where the second transparent member 40 has a round-shaped surface as shown in this Figure, light emitted from the light emitting element can be radiated through the round-shaped transparent member the without directivity. Particularly, the second transparent member 40 can serve as an optical lens. In this case, it is possible to provide a light emitting device that can uniformly radiate light in all directions. For example, the second transparent member 40 can be formed of a silicone resin, an epoxy resin, glass, or the like. In addition, the second transparent member 40 can be formed in any curved optical lens shape by transfer molding or the like.

Figure 5:
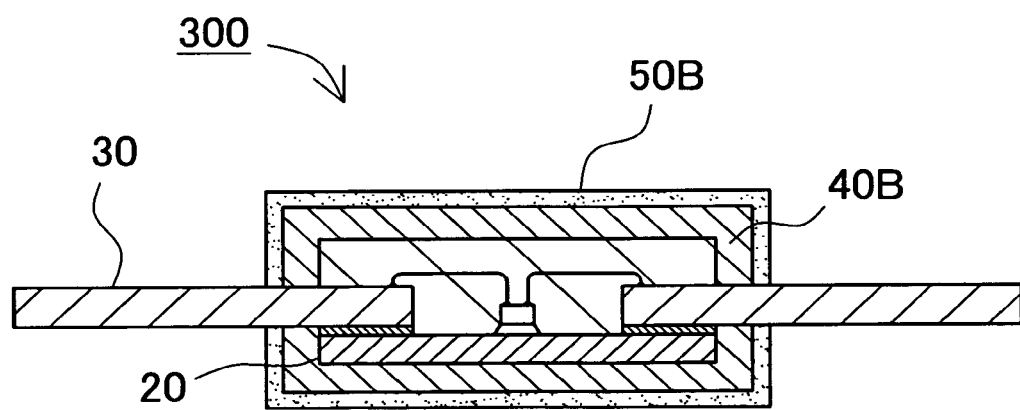
FIG. 5 is a cross-sectional view showing a light emitting device with a transparent member being formed in a rectangular-parallelepiped shape.

On the other hand, it is not always necessary to form the second transparent member 40 in optical lens shape or other curved shapes such as round shape. For example, as shown in a light emitting device 300 of FIG. 5, a second transparent member 40B may have a rectangular-parallelepiped shape. In the case of rectangular-parallelepiped shape, there is an advantage that provides easy molding. In addition, in construction that attaches the light emitting device in the transparent bulb 60 as discussed later, the transparent bulb 60 can serve as an optical lens. Therefore, there is also an advantage that simplifies the construction of the transparent member 40.

In addition, a wavelength conversion member 50 can be disposed around the periphery of the light emitting element 10 as shown in FIG. 4 as necessary. The wavelength conversion member 50 can absorb light emitted by the light emitting element 10 and convert its wavelength so as to emit luminescent radiation with different wavelength. A resin film or glass film containing a phosphor can be suitably used as this wavelength conversion member 50. For example, in the illustration of FIG. 5, the wavelength conversion member 50B containing a phosphor is formed in a film shape on the surface of the transparent member 40 as a wavelength conversion film by coating. Thus, in the case where the transparent member is uniformly formed on the curved surface of the optical lens shape, uniform mixture light can be obtained. Additionally, a phosphor can be unevenly distributed in the wavelength conversion film depending on the number and arrangement of light emitting elements to be used. In other words, it is not necessary to provide the wavelength conversion member around the whole periphery of the light emitting element. The wavelength conversion member may be distributed so that a phosphor is highly weighted in regions where a light amount is high such as upper and lower surfaces.

Figure 6:
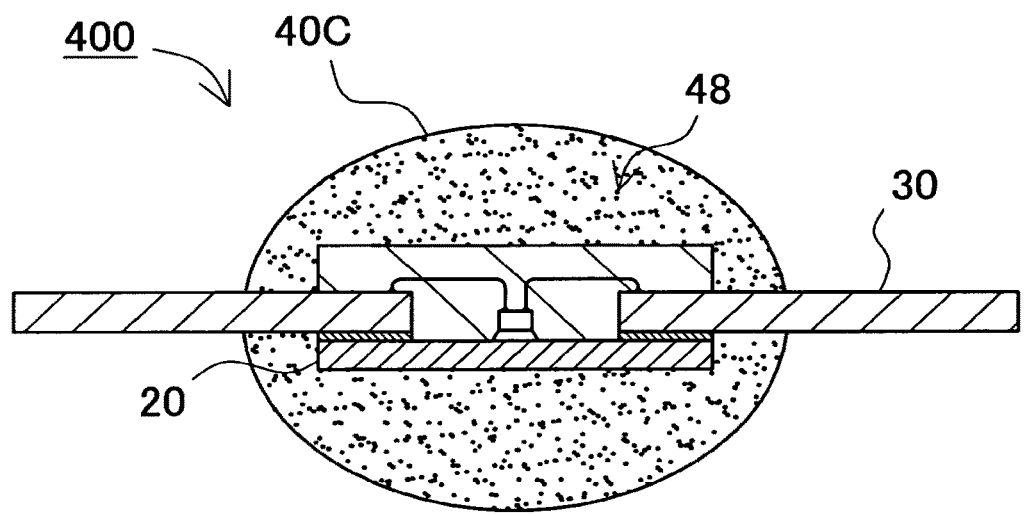
FIG. 6 is a cross-sectional view showing a light emitting apparatus with a wavelength conversion member and a transparent member being formed unitarily.
Figure 7:
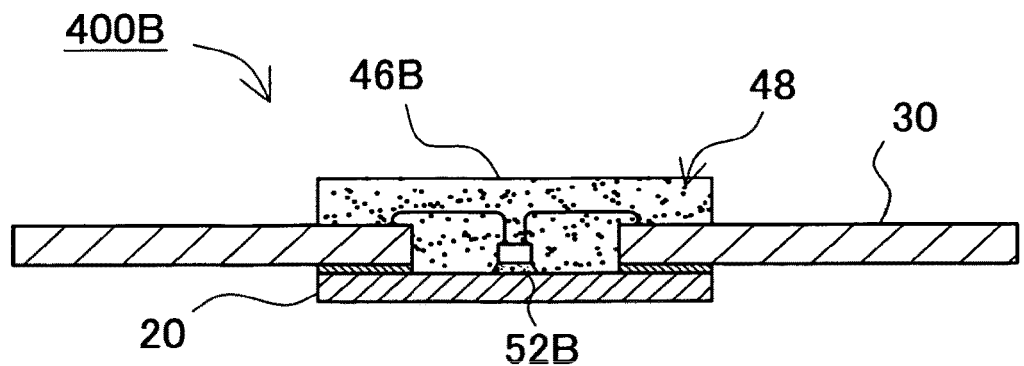
FIG. 7 is a cross-sectional view showing a light emitting device with a wavelength conversion member and a sealing member being formed unitarily.

In addition, the second transparent member 40 can additionally serve as the wavelength conversion member 50. For example, as shown in a light emitting device 400 of FIG. 6, a phosphor 48 can be mixed into an epoxy resin as the transparent member 40C so that the transparent member 40C serves as a wavelength conversion member. Alternatively, as shown in a light emitting device 400B of FIG. 7, a covering member 46B can additionally serve as a wavelength conversion member. In other words, a phosphor 48 is mixed into a silicone resin that forms the covering member 46B so that the covering member 46B serves as both a covering member and a wavelength conversion member. In this case, it is possible to provide an effect that reduces the number of production processes and production cost. Additionally, the wavelength of light emitted from the whole surfaces including the lower surface in an LED chip can be converted by mixture of the phosphor 48 not only into the covering member 46B but also into a die-bonding member 52B, lamination coating on the periphery of the transparent board 20 with a phosphor film, or the like. Alternatively, construction in which a wavelength conversion layer is formed by applying a phosphor on the interior surface of a transparent bulb is also applicable.

Transparent Bulb 60

Figure 8:
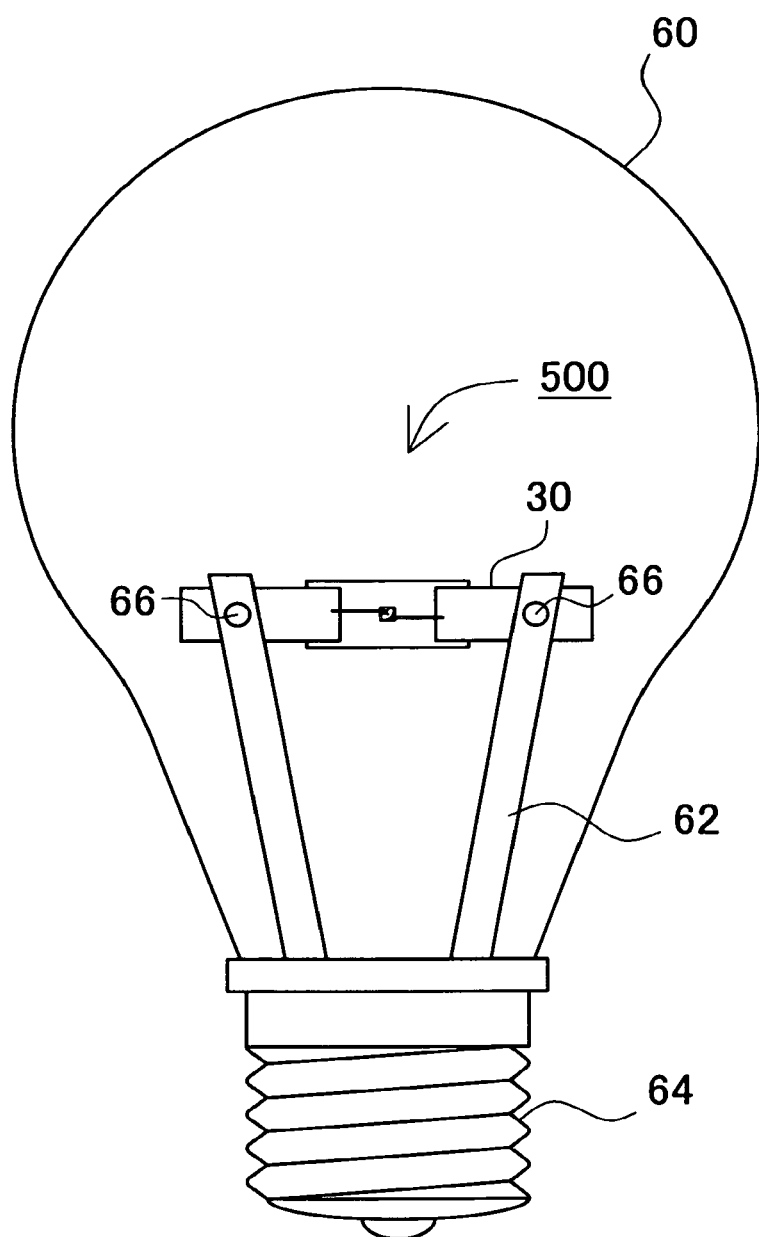
FIG. 8 is a cross-sectional view showing a light emitting device with a packaged light emitting device being installed in a side-up position in a transparent bulb.
Figure 9:
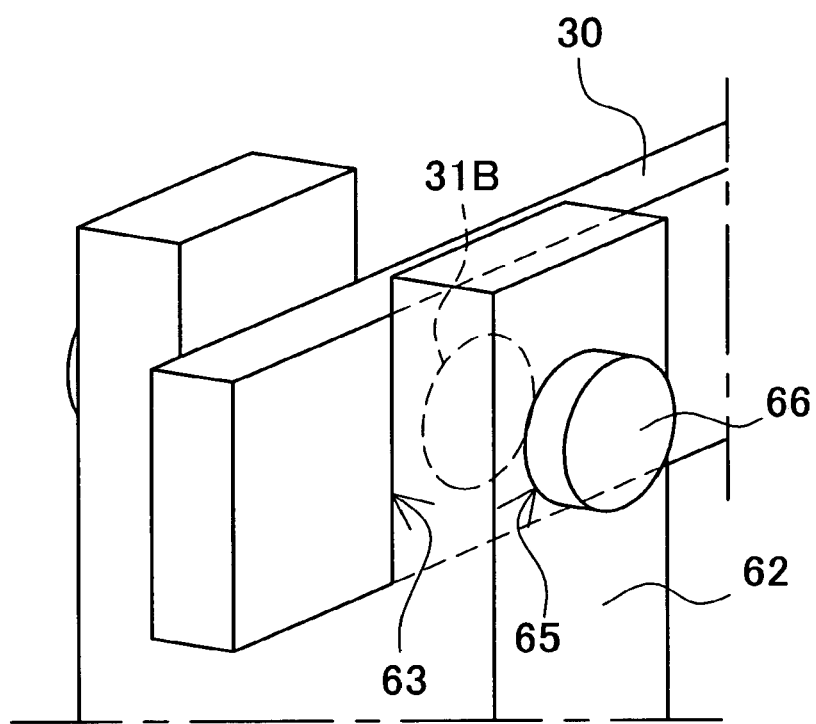
FIG. 9 is an enlarged, perspective view showing an installation portion where the packaged light emitting device is supported by a support lead illustrated in FIG. 8.

Although a light emitting device 500, which is constructed as discussed above, can be used alone, it can be attached to a lighting apparatus so that it is easily handled for lighting application. FIG. 8 is a cross-sectional view showing the transparent bulb 60 with the lighting apparatus 500 according to the embodiment being disposed therein. The transparent bulb 60 is designed in a shape similar to a filament lamp but is provided with the lighting apparatus 500 instead of filament. The transparent bulb 60 is a light-bulb-shaped member that is composed of transparent glass or the like. A pair of support leads 62 are disposed inside the transparent bulb 60. Ends of the pair of support leads 62 are provided with slots that accommodate external connection terminal portions of the metal plates 30 of the light emitting device. As shown in an enlarged, perspective view of FIG. 9, in this illustration, the ends of the support leads 62 have recessed portions 63. The metal plates 30 are inserted into the recessed portions 63 and are fastened with screws, or the like. For example, the metal plates 30 of the light emitting device 500 is provided with plate-side screw holes 31B that open as shown in FIG. 9 to be fastened with the screws. On the other hand, the support leads 62 are also provided with lead-side screw holes 65 that are formed at locations corresponding to the plate-side screw holes 31B. As shown in FIG. 8, in the state where an LED chip of the light emitting device 500 faces to a side surface of the light emitting element 500, the metal plates 30 are inserted into the recessed portions 63 so as to be located in place. Screws 66 are then inserted from a horizontal side into the plate-side screw holes 31B and the lead-side screw holes 65 for threaded engagement. This engagement can ensure attachment of the light emitting device. Alternatively, even in the case where the support leads 62 are not provided with only the lead-side screw holes 65 without recessed portions, screws can be inserted into the plate-side screw holes and the lead-side screw holes to attach the light emitting device by threaded engagement. Attachment is not limited to threaded engagement, needless to say, other methods such as rivet, caulking, welding, bonding, retainment, engagement and fit can be used.

In addition, since the LED chip is attached so that its upper surface faces a side surface of the transparent bulb, there is an advantage that directly and outwardly directs light that outgoes through the upper and lower surfaces of the LED chip. In other words, in the case of a conventional LED, since light outgoes in one direction, a reflection film or reflector is disposed. This construction tends to enhance directivity. For this reason, there is a problem this type of LED is unsuitable for lighting application that requires broad light emission. Additionally, the reflection film or reflector does not allow light to outgo totally. In the case where the LED chip is oriented so that its upper surface faces a side surface of the lighting apparatus, light that outgoes through the upper and lower surfaces of the LED chip is directed outward as light output directly. Therefore, light from the LED chip can effectively outgo. This construction can eliminate a reflector and so on, and provide an advantage in cost. Additionally, this construction can avoid the problems that lose light due to a reflection member and enhances directivity. An LED chip typically emits light through not only its upper and lower surfaces but also through its side surfaces. In the light emitting device according to the embodiment, light that is thus emitted by the light emitting element effectively outgoes through all surfaces. Therefore, it is possible to effectively radiate light through the side surfaces, and the upper and lower surfaces of the light emitting device.

Figure 10:
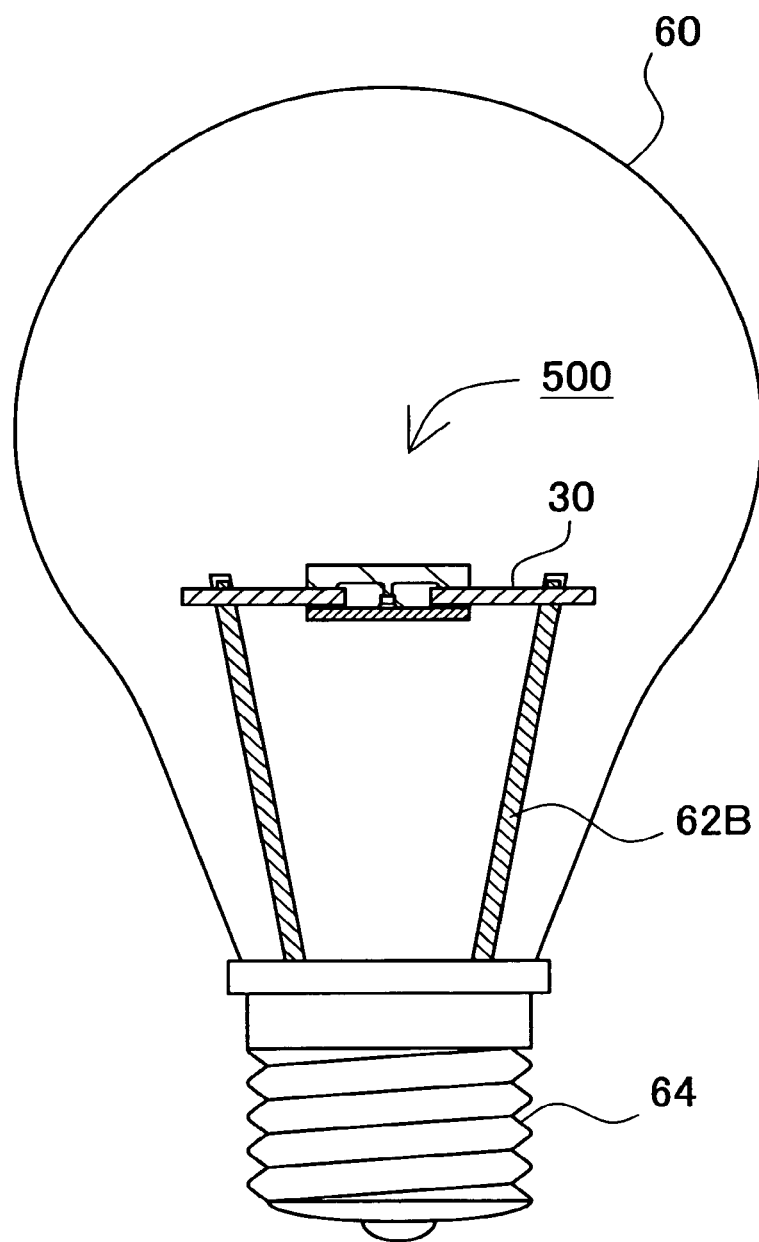
FIG. 10 is a cross-sectional view showing a light emitting device with a packaged light emitting device being installed in a top-side-up position in a transparent bulb.
Figure 11:
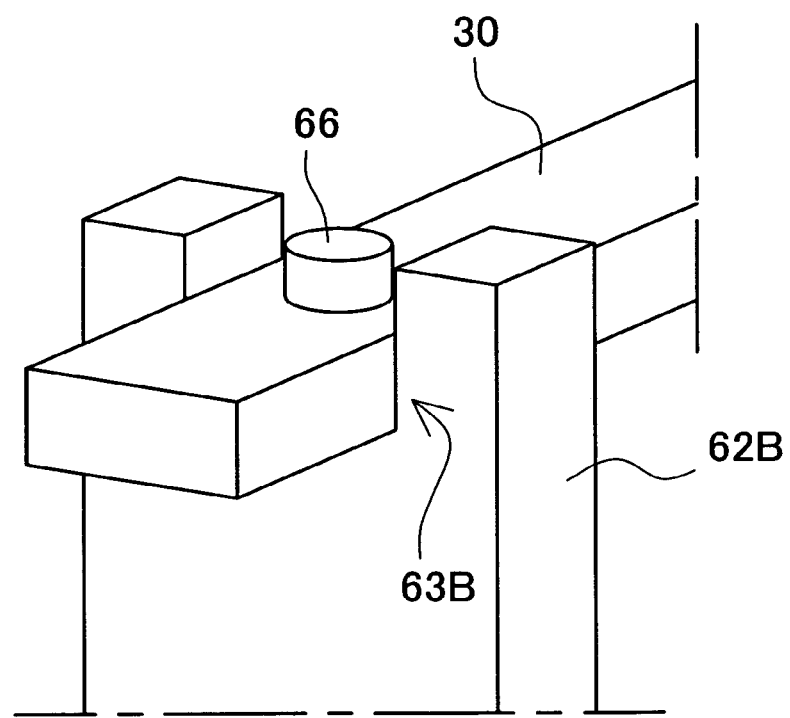
FIG. 11 is an enlarged, perspective view showing an installation portion where the packaged light emitting device is supported by a support lead illustrated in FIG. 10.

On the other hand, as shown in FIG. 10, the light emitting device can be attached so that the LED chip is oriented so that its upper surface faces the upper side of transparent bulb. In the light emitting device according to this embodiment, since light outgoes from the LED chip through all the peripheral surfaces such as the upper, lower and side surfaces, it is possible to provide broad light emission even in the case where the light emitting device is oriented in any directions. It is important to optimize elimination of a member that cuts off light from the LED chip, that is, to bring the LED chip closer to a suspended state inside a light emitting apparatus such as transparent bulb so that light emitted through all the peripheral surfaces of the LED chip can effectively outgo. This construction can provide a light emitting device that serves as a suitable lighting apparatus capable of illuminating a wide area. In the illustration of FIG. 10, as shown in FIG. 11, the ends of the support leads 62B have recessed portions 63B. The metal plates 30 are inserted into the recessed portions 63 and are attached with the screws 66 that are inserted from the top side by threaded engagement or the like.

In addition, the transparent bulb 60 is provided with a base 64 that can be threadedly engaged with a conventional socket for light bulb. Terminals of the base 64 are connected to the support lead 62. The light emitting element 10 of the packaged light emitting apparatus 500 is constructed to be operated by power that is supplied to the terminals of the base 64. In this case, this light emitting device can be used similarly to conventional light bulbs. Therefore, it is possible to easily replace a conventional light bulb used in lighting with the light emitting element. Particularly, the light emitting device, which employs an LED chip or the like, is operated at low power consumption and less heat generation. Additionally, the light emitting device has long life as compared with filament lumps. As a result, maintenance such as bulb replacement can be eliminated. The light emitting device is suitable for requirements for resource savings and trash reduction. Therefore, the light emitting device is very advantageous as next-generation lighting.

On the other hand, conventional light emitting elements such as LED have high directivity, and thus are not suitable in use as lighting that provides broad light emission. On the contrary to this, in the light emitting device, the transparent board 20 that is provided the light emitting element 10 mounted thereon passes light, and the transparent member 40 is formed around all the peripheral surfaces of the light emitting element 10. This construction allows light to outgo through all the peripheral surfaces. Therefore, the light emitting device can be used for typical lighting application that provides broad light emission.

In addition, the transparent bulb 60 can have various types of designed shapes as lighting. The transparent bulb 60 can have a shape similar to conventional light bulbs so that they are replaced by the transparent bulb, and, needless to say, can have special-purpose designed shapes. For example, the transparent bulb can have a cylindrical shape. In addition, a phosphor layer may be applied as a wavelength conversion member on the interior surface of this cylindrical-shaped transparent bulb. In this lighting apparatus, the packaged light emitting device that is deposed therein does not include a wavelength conversion member, but a coating that is mixed with a phosphor is applied on the interior surface of the transparent bulb as a wavelength conversion member. Alternatively, both the packaged light emitting device and the transparent bulb can have wavelength conversion members. Combination of wavelength conversion members that include a plurality of phosphors can provide two- or three-wavelength lighting, or the like, and thus can provide a desired light color.

In addition, the transparent bulb can be filled with a filling material, or can be formed in solid by molding. The LED chip and phosphor are protected from external stress, moisture, dust and so on by a filling member or molding. Particularly, in the case of a relatively small lighting apparatus, since a molding amount is small, a problem that increases its weight does not arise. In this case, this type of transparent bulb can be suitably used.

Support Lead 62

The support leads 62 are formed of an excellent electrically and thermally conductive metal such as stainless steel alloy, iron, copper and aluminum. On the other hand, the support leads 62 can be preferably formed of the material as the metal plate 30. In the case where the light emitting device 500 is electrically conductively and thermally conductively attached to the support lead 62, the light emitting device 500 is provided with power through the support leads 62, and heat generated in the light emitting device 500 is conducted to the support leads 62 and is dissipated.

Figure 12:
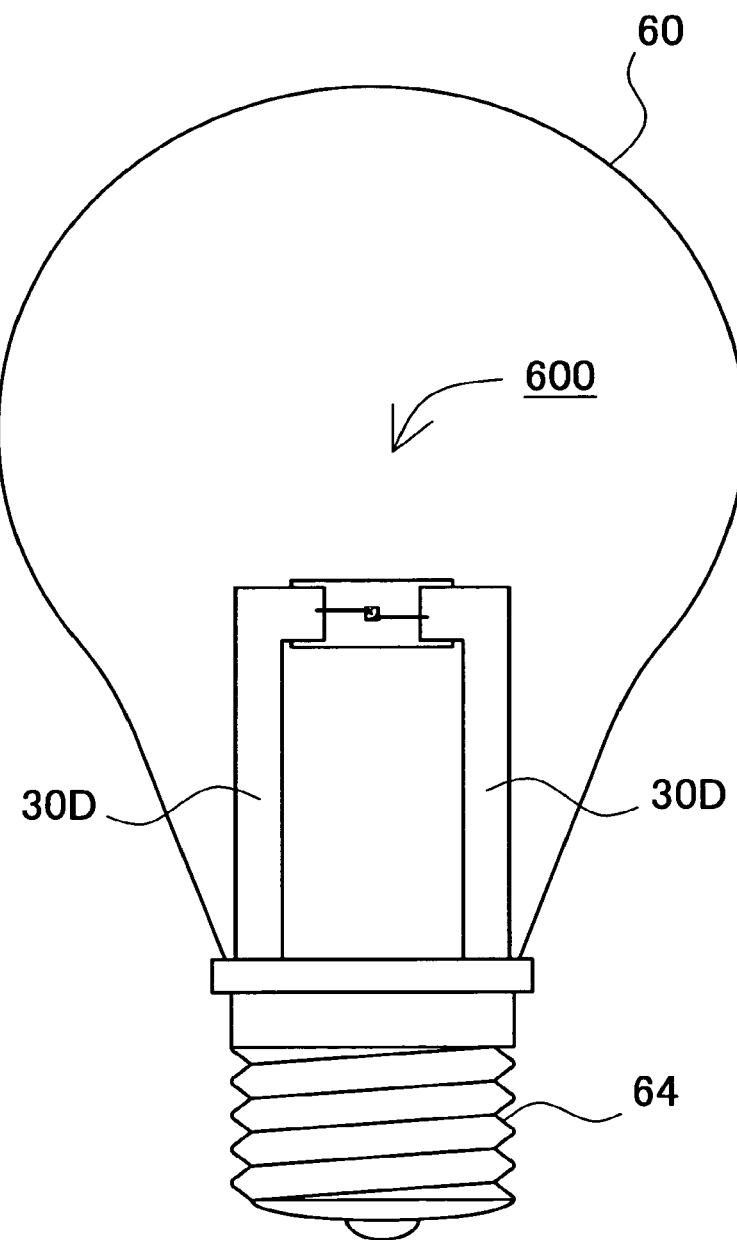
FIG. 12 is a cross-sectional view showing a light emitting device with a packaged light emitting device being installed through elongated conductor members in a transparent bulb.

Alternatively, as shown in FIG. 12, metal plates 30D of a packaged light emitting device 600 can be bent and extend so as to fastened to the inside of the base 63. In this case, the metal plates 30D serves as both the metal plates and the support leads. Therefore, it is possible to reduce a parts count, and the number of production processes.

The chamber of the transparent bulb 60 can contain air. But the chamber of the transparent bulb 60 may be airtightly enclosed and filled with an inert gas or maintained under vacuum. For example, in the case where oxygen is eliminated from the chamber, it is possible to reduce deterioration due to oxidation of the metal plates 30 that project from the packaged light emitting device 500. In this case, it is possible to improve reliability of the packaged light emitting device 500.

On the other hand, the support leads 62, which support the light emitting device 500 and are disposed inside the transparent bulb 60, may provide detachable engagement of the light emitting device 500. In this case, a light emitting device with reduced output power can be replaced, or a light emitting device can be replaced by another packaged light emitting device with different color light emission. This type of light emitting device is more convenient.

In the case where the packaged light emitting device is thus accommodated in the transparent bulb, it is not necessary to form the second transparent member that covers the light emitting element.

In the aforementioned illustrations, the metal plates 30 are disposed on the transparent board 20 in substantially mirror images of each other, and are connected with wire lines 44. However, the metal plates 30 are not limited to this construction. In the illustration of FIG. 1 or the like, the light emitting element 10 has an insulating lower surface and an upper surface that is provided with n-side and p-side electrodes, and thus requires two wire lines 44. However, in the case where a light emitting element has a lower surface that is provided with an electrode (e.g., n-side electrode), a transparent board can be formed of a conductive material. In this case, only one wire line, which is connected to its upper surface, can provide electrical conduction.

Light Emitting Element 10

In this specification, light emitting elements such as LED and LD can be used as the light emitting element 10. In this embodiment of the present invention, a light emitting element with wavelength 550 nm or less, preferably 460 nm or less, and more preferably 410 nm or less is used as the light emitting element 10. For example, an ultraviolet light LED, which emits light with wavelength of 250 nm to 365 nm as ultraviolet light, can be used. For example, an LED chip that emits ultraviolet light can be used as the light emitting element 10 so that the wavelength conversion member 50 converts the ultraviolet light into visible light. In this specification, light is used in a sense that includes visible light and invisible light.

Various types of nitride semiconductors can be used as semiconductor layers, which compose an LED or an LD. Specifically, a plurality of layers that is formed of semiconductors such as $In_xAl_yGa_{1-x-y}N$ ($0 \leq x$, $0 \leq y$, $x+y \leq 1$) are formed on a growth substrate by Metal-Organic Chemical Vapor Deposition (MOCVD), Hydride Chemical Vapor Deposition (HVPE), or the like. Generally, semiconductor layers grow on a particular growth substrate, and thus form an LED. For example, well-known materials such as sapphire, spinel, SiC, GaN and GaAs can be used as growth substrate. In the case where an insulating substrate such as sapphire is used, finally the insulating board may be removed.

In addition the main peak light emission wavelength of the light emitting element 10 can be varied within a range between 420 nm and 490 nm. Additionally, the light emission wavelength is not limited to the above range, but a light emitting element with wavelength of 360 nm to 550 nm can be used. Particularly, in the case where an ultraviolet LED light emitting device is employed for the light emitting device, the absorption-and-conversion efficiency of excitation light can be improved. Therefore, it is possible to reduce penetrating ultraviolet light.

Phosphor

A phosphor converts visible light or ultraviolet light that is emitted from the light emitting element 10 into light with different wavelength. In this case, the phosphor is used as a wavelength conversion material, which absorbs light and emits luminescent radiation with wavelength longer than the wavelength of absorbed light. Light emission of the light emitting element 10 and the converted radiation are mixed to emit desired color light externally. The phosphor is transparent, and is excited by light emitted from a semiconductor light emitting layer of LED, for example, and thus emits luminescent radiation. A YAG group phosphor activated by europium, zinc sulfide coactivated by silver and aluminum, a nitride group phosphor such as alkaline-earth silicon-nitride phosphor, and an oxynitride group phosphor such as alkaline-earth silicon oxynitride phosphor can be used as preferable phosphor. In addition, a phosphor that is excited by ultraviolet light and emits luminescent radiation of a desired color may be used.

A phosphor that has the luminescent spectrum in a yellow, red, green or blue region due to excitation by light from the light emitting element 10 can be used. In addition, a phosphor that has the luminescent spectrum in the intermediate color region of them, such as yellowish green, bluish green and orange, can be also used. Various combinations of these phosphors can provide light emitting devices with various light emission colors.

For example, a phosphor consisting of $CaSi_2O_2N_2$:Eu or $SrSi_2O_2N_2$:Eu, which emits green to yellow luminescent radiation, $(Sr,Ca)_5(PO_4)_3Cl$:Eu, which emits blue luminescent radiation, and $(Ca,Sr)_2Si_5N_8$:Eu, which emits red luminescent radiation is used. In this case, it is possible to provide a light emitting device that emits white light and has excellent color rendering. The reason is that, since red, blue and green of the primary colors are used, variation of the composition ratio of first and second phosphors can provide desired white light.

The average particle size of phosphor is 3 μm or more, and preferably 5 μm to 15 μm. Very small phosphor is classified and removed by classification or the like so that particles with particle size of 2 μm or less occupy not more than 10% in volume distribution. Accordingly, light emission luminance can be improved. Additionally, chromaticity unevenness depending on light direction is reduced by reducing the number of particles with particle size of 2 μm or less.

In this case, the particle size means an average particle size that is obtained by an air permeation method. Specifically, the particle size is converted as average particle size from a relative surface area value that is obtained based on pressure difference, under environmental condition at temperature of 25° C. and humidity of 70%, in a state where air flows through a special tubular vessel at a constant pressure, wherein the vessel is provided with a sample of measured volume of 1 cm³ that is packed therein. The phosphor used in the embodiment preferably has an average particle size of 2 μm to 8 μm. In addition, it is preferable that phosphor particles with average particle size in this range are highly included. Additionally, particles are preferably distributed in a narrow range. It is preferable that there are few particles with particle size not more than 2 μm. In the case where a phosphor with small particle size and less unevenness of particle size distribution is used, color unevenness can be reduced. Therefore, it is possible to provide a light emitting device with an excellent color tone.

Wavelength Conversion Member 50

The wavelength conversion member 50 containing a phosphor is composed of resin with the aforementioned phosphors mixed therein. A thermosetting resin can be used for phosphor-containing resin that composes the wavelength conversion member 50. It is preferable that the phosphor is substantially uniformly contained in the phosphor-containing resin. However, a phosphor material may be unevenly mixed so as to partially exist. For example, a phosphor is distributed so that much of the phosphor material is included on the exterior surface side of the phosphor-containing resin. In this case, much of the phosphor is spaced away from a contact surface between the light emitting element 10 and the phosphor-containing resin, thus, heat generated by the light emitting element 10 is less prone to conducted to the phosphor. Therefore, it is possible to suppress deterioration of the phosphor. A silicone resin composition, a denatured silicone resin composition or the like is preferably used as the phosphor-containing resin. However, a transparent, insulating resin composition such as epoxy resin composition, denatured epoxy resin composition and acrylic resin composition or the like can be used. In addition, pigment, diffusion agent and so on can be mixed into the phosphor-containing resin.

It is preferable that the phosphor-containing resin is soft even after curing. Before curing, it is preferable that the phosphor-containing resin is liquid with low viscosity. The reason is that the phosphor-containing resin spreads over the periphery of the light emitting element 10, and that the phosphor-containing resin fills interstices except that electrical connection parts between the light emitting element 10 that is mounted in a flip chip manner and lead terminals. In addition, the phosphor-containing resin preferably has adhesiveness. In the case where the phosphor-containing resin has adhesiveness, it is possible to improve adhesion between the light emitting element 10 and the transparent board 20. The resin that has adhesiveness includes not only a material that provides adhesiveness at room temperature, but also a material that provides adhesiveness when predetermined heat and pressure are applied to the phosphor-containing resin. Additionally, in order to improve the adhesive strength, the phosphor-containing resin can be subjected to heat or pressure, or can be dried.

Diffusion Agent

In addition, a diffusion agent can be added to the phosphor-containing resin in addition to a phosphor. Specifically, barium titanate, titanium oxide, aluminum oxide, silicon oxide, and so on, can be suitably used as the diffusion agent. In this case, it is possible to provide a light emitting device with suitable directivity.

In this specification, the diffusion agent refers to a material that has a center particle size not less than 1 nm to less than 5 µm. The diffusion agent of not less than 1 nm to less than 5 µm excellently scatters light from the light emitting element 10 and phosphor, and thus suppresses color unevenness that tends to appear in the case where a phosphor with a large particle size is used. For this reason, this type of diffusion agent is suitably used. In addition, the spectral half-value width in light emission can be narrow. Therefore, it is possible to a light emitting device with high color purity. A diffusion agent of not less than 1 nm to less than 1 µm has a small interference effect on the wavelength of light from the light emitting elements 10, but has high transparency, and additionally can increase viscosity of resin without reduction of luminous intensity.

Filler

In addition, a filler can be added to the phosphor-containing resin in addition to a phosphor. Specifically, materials similar to the diffusion agent can be used as a material of the filler. But, the filler has a center particle size different from the diffusion agent. In this specification, the filler preferably has a center particle size of not less than 5 µm to not more than 100 µm. In the case where a transparent resin contains this type of filler, chromaticity unevenness of the light emitting device can be improved by light dispersion, and additionally thermal shock resistance of the transparent resin can be improved. Accordingly, it is possible to provide a highly reliable light emitting device that can prevent disconnection of wire lines 44 that connect light emitting element 10 and external terminals, detachment of the bottom surfaces of the light emitting element 10 from the bottom surface of the recessed portion of the package, and so on, even in use under high temperature. Additionally, the resin can be adjusted so as to have constant flowability for a long time. As a result, a sealing resin can be formed in a desired location. Therefore it is possible to mass-produce the light emitting devices at high yield.

Figure 13:
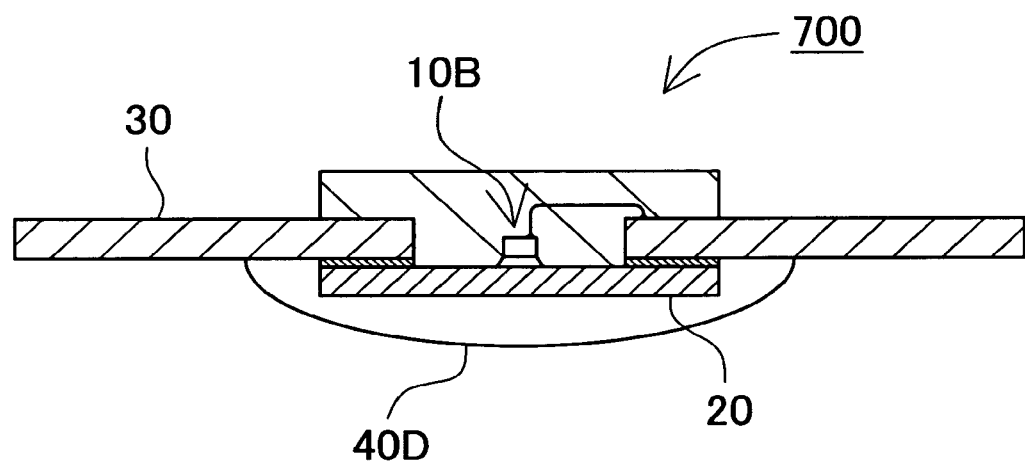
FIG. 13 is a cross-sectional view showing a light emitting device with an optical lens being located on the lower side of a transparent board.

In the case where the thus-constructed light emitting device is used, it is possible to provide a high degree of flexibility in designing, and thus to provide various types of designs. For example, a light emitting device 700 in a form shown in FIG. 13 can be constructed to satisfy functions or designs required in lighting applications. In the light emitting device 700 shown in FIG. 13, an optical lens 40D is disposed only on the lower side of the transparent board 20. Light that passes through the transparent board 20 can outgo in a light emitting element 10 mount direction. In this construction, light that outgoes in various directions can be directed in one direction. Therefore, it is possible to provide a light emitting device that can emit light at high luminance.

Although the light emitting device is constructed so that the wavelength conversion member 50 is located around the light emitting element 10 in the foregoing illustration, a light emitting device that does not have a wavelength conversion member can be constructed so as to emit light from the light emitting device directly as it is. For example, a blue, yellow, green lighting device or the like that includes a blue, yellow or green LED can be provided.

Figure 15:
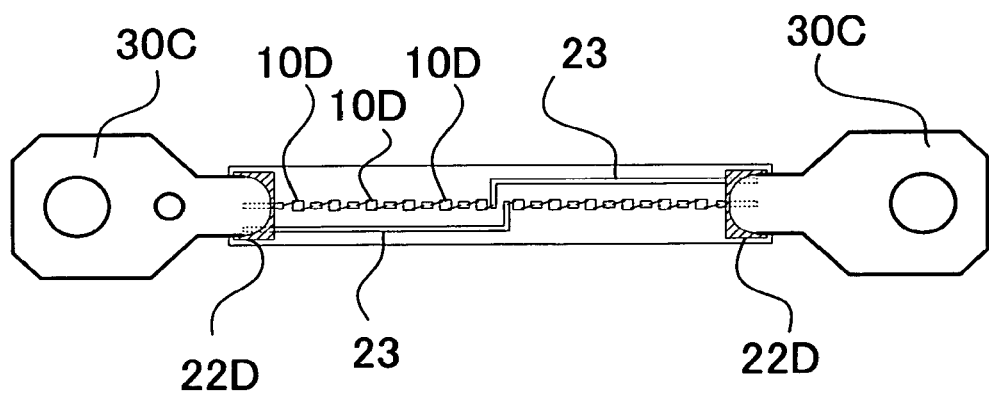
FIG. 15 is a plan view showing a light emitting device with a plurality of light emitting elements being aligned in a longitudinal direction.
Figure 16:
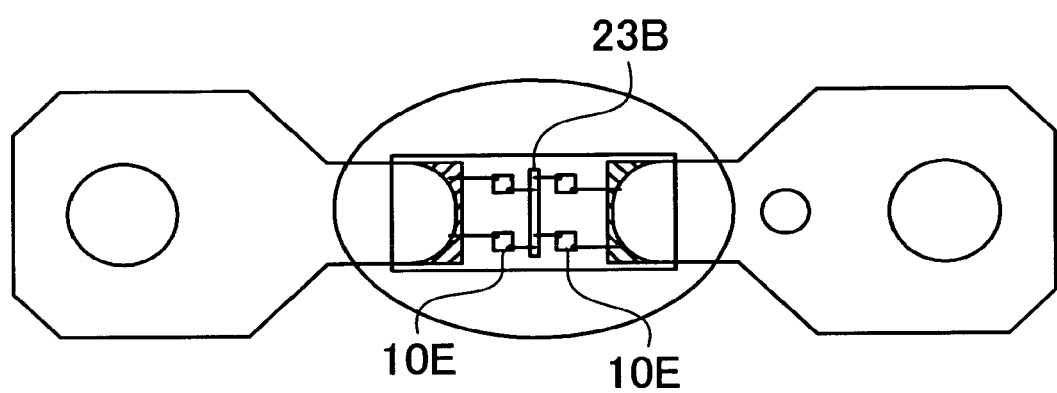
FIG. 16 is a cross-sectional view showing a light emitting device with a lead region being separately provided.

The light emitting device that includes single LED chip is discussed in the foregoing illustration. However, a plurality of the light emitting elements 10 can be used. For example, as shown in a plan view of FIG. 14, a light emitting device 1200 includes four LED chips 10C. Two LED chips among the LED chips 10C are connected in serial as one set between a pair of metal plates 30C. Two sets in which the two LED chips 10C are connected in serial are electrically connected in parallel. In this case, it is possible to increase output power. In addition, as shown in a plan view of FIG. 15, a light source can have a plurality of LED chips 10D that aligns in a line that extends in a filament-longitudinal direction. In illustration of FIG. 15, twelve LEDs 10D align in the horizontal direction. Six LEDs among them are connected in serial as one set. Two sets in which the six LEDs of them are connected in serial are connected in parallel. Additionally, in order to provide easy connection by wire-bonding, lead regions 23 extend from respective conductor members 22D in proximity to the center of the light source. Moreover, as shown in FIG. 16, common lead region 23B may be independently disposed the center of light source so that LED chips 10E are connected to the common lead region 23B by wire-bonding.

According to this embodiment, it is possible to provide a lighting apparatus that uses the light emitting element 10 and thus has high performance. In conventional light emitting devices, an LED chip is mounted on the metal plate 30, thus, there is a problem that cuts off light that travels downwardly by the conductor 22 member. On the contrary to this, the lower surface light emission region of the light emitting element 10 is not disposed directly on the conductor member 22. In other words, the conductor members 22 are not located so as to face the upper and lower surfaces as the largest surfaces of LED chip that composes the light emitting element 10, but the conductor members 22 are located on the side-surface sides of the LED chip. This arrangement allows light to outgo downwardly.

Generally, since an insulating board is used as a board that is provided with the light emitting element 10 mounted thereon, this type of board has poor heat conductivity, and thus provides insufficient heat dissipation. If this type of light emitting element 10 is enclosed in a glass bulb as it is, temperature rises, thus, its reliability decreases. In this embodiment, the light emitting element 10 is disposed on the transparent board 20, thus, its heat conductivity and heat dissipation are improved. In addition, in the case where the transparent board 20 is electrically conductive, this construction provide great improvement of heat conductivity. Thus, the light emitting element 10 with high output power can be stably used. Therefore, it is possible to provide high performance and high reliability.

A light emitting device according to the embodiment can be applied to a light source for lighting, an LED display, a back light source, a signal light, an illuminated switch, various sensors, various indicators and so on, which have a blue or ultraviolet light emitting diode as a light source and has excellent white light emission, for example. A method for producing can be applied to them.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims.

What is claimed is:

1. A light emitting device comprising:
   a bulb having a side surface defining a hollow space therein;
   a board elongated longer in a first direction than in a second direction perpendicular to the first direction;
   a plurality of light emitting elements mounted on the board, each light emitting element of the plurality of light emitting elements having an upper surface and a lower surface opposite to the upper surface, the lower surface mounted on the board;
   a plurality of sets of metal plates and leads electrically connected to the plurality of light emitting elements, each set including a metal plate and a lead, the plurality of sets including a first set and a second set, the first set including a first metal plate and a first lead, the second set including a second metal plate and a second lead; and
   a wavelength conversion member adapted to convert wavelength of light emitted from the plurality of light emitting elements, the wavelength conversion member covering the plurality of light emitting elements and a portion of each of the metal plates, wherein
   the board, the plurality of light emitting elements, the plurality of sets of metal plates and leads, and the wavelength conversion member are disposed in the hollow space of the bulb,
   the first metal plate, the board, and the second metal plate are arrayed along the first direction,
   the plurality of light emitting elements are arrayed on the board along the first direction,
   the upper surface of each of the plurality of light emitting elements faces the side surface of the bulb, and
   the first metal plate and one of the plurality of light emitting elements closest to the first metal plate are electrically connected with wire.

2. The light emitting device according to claim 1, wherein a thickness of each metal plate in the second direction is smaller than a width of the board in the second direction.

3. The light emitting device according to claim 1,
   wherein the board has a first surface and a second surface opposite to the first surface, and
   wherein the board is transparent so that light emitted from the plurality of light emitting elements on the first surface of the board radiates outside of the light emitting device through the second surface of the board.

4. The light emitting device according to claim 1, wherein the plurality of light emitting elements is electrically connected in series.

5. The light emitting device according to claim 1, wherein the wavelength conversion member contains a YAG group phosphor.

6. The light emitting device according to claim 1, wherein the wavelength conversion member contains a nitride group phosphor.

7. The light emitting device according to claim 1, wherein the wavelength conversion member contains an oxynitride group phosphor.

8. The light emitting device according to claim 1, wherein the plurality of light emitting elements comprises a nitride semiconductor.

9. The light emitting device according to claim 8, wherein the plurality of light emitting elements comprises $In_xAl_yGa_{1-x-y}N$ ($0 \leq x$, $0 \leq y$, $x+y \leq 1$).

10. The light emitting device according to claim 1, wherein the plurality of light emitting elements is configured to emit light having a wavelength in a range of 360 to 550 nm.

11. The light emitting device according to claim 1, wherein the wavelength conversion member has a curved surface.

12. The light emitting device according to claim 1, wherein
   each of the metal plates has a first surface and a second surface, and
   the first surface of the metal plate faces at least one of the leads.

13. The light emitting device according to claim 1, wherein the first metal plate and one of the plurality of light emitting elements closest to the first metal plate are electrically directly connected with wire.

14. The light emitting device according to claim 1, wherein the wavelength conversion member has a curved profile in a sectional-plane extending along the first direction and perpendicular to a surface of the board upon which the plurality of light emitting elements are mounted.

15. The light emitting device according to claim 1, wherein the upper surface and the lower surface of each of the plurality of light emitting elements are surrounded by the wavelength conversion member.

16. A light emitting device comprising:
a bulb having a side surface defining a hollow space therein;
a board elongated longer in a first direction than in a second direction perpendicular to the first direction;
a plurality of light emitting elements mounted on the board, each of the plurality of light emitting elements having an upper surface and a lower surface opposite to the upper surface, the lower surface mounted on the board;
a plurality of metal plates electrically connected to the plurality of light emitting elements, the plurality of metal plates including a first metal plate and a second metal plate;
a plurality of leads electrically connected to the plurality of metal plates; and
a wavelength conversion member adapted to convert wavelength of light emitted from the plurality of light emitting elements, the wavelength conversion member covering the plurality of light emitting elements and a portion of each of the metal plates, wherein
the board, the plurality of light emitting elements, the plurality of metal plates and the wavelength conversion member are disposed in the hollow space of the bulb,
the first metal plate, the board, and the second metal plate are arrayed along the first direction,
the plurality of light emitting elements are arrayed on the board along the first direction,
the upper surface of each of the plurality of light emitting elements faces the side surface of the bulb, and
the first metal plate and one of the plurality of light emitting elements closest to the first metal plate are electrically connected with wire.

17. The light emitting device according to claim 16, wherein the first metal plate and one of the plurality of light emitting elements closest to the first metal plate are electrically directly connected with wire.

18. The light emitting device according to claim 16, wherein the wavelength conversion member has a curved profile in a sectional-plane extending along the first direction and perpendicular to a surface of the board upon which the plurality of light emitting elements are mounted.

19. The light emitting device according to claim 16, wherein
each of the metal plates has a first surface and a second surface, and
the first surface of the metal plate faces at least one of the leads.

20. A light emitting device comprising:
a bulb having a side surface defining a hollow space therein;
a board elongated longer in a first direction than in a second direction perpendicular to the first direction;
a plurality of light emitting elements mounted on the board, each of the plurality of light emitting elements having an upper surface and a lower surface opposite to the upper surface, the lower surface mounted on the board;
a plurality of metal plates electrically connected to the plurality of light emitting elements;
a plurality of leads electrically connected to the plurality of metal plates; and
a wavelength conversion member adapted to convert wavelength of light emitted from the plurality of light emitting elements, the wavelength conversion member covering the plurality of light emitting elements and a portion of each of the metal plates, wherein
the board, the plurality of light emitting elements, the plurality of metal plates and the wavelength conversion member are disposed in the hollow space of the bulb,
the first metal plate, the board, and the second metal plate are arrayed along the first direction,
the plurality of light emitting elements are arrayed on the board along the first direction,
the upper surface of each of the plurality of light emitting elements faces the side surface of the bulb, and
the upper surface and the lower surface of each of the plurality of light emitting elements are surrounded by the wavelength conversion member.

* * * * *